(12) United States Patent
Wang et al.

(10) Patent No.: US 11,467,203 B2
(45) Date of Patent: Oct. 11, 2022

(54) TEST CIRCUIT AND METHOD

(71) Applicant: TAIWAN SEMICONDUCTOR MANUFACTURING COMPANY LIMITED, Hsin-Chu (TW)

(72) Inventors: Mill-Jer Wang, Hsinchu (TW); Ching-Nen Peng, Hsinchu (TW); Hung-Chih Lin, Hsinchu (TW); Sen-Kuei Hsu, Kaohsiung (TW); Chuan-Ching Wang, Hsinchu (TW); Hao Chen, New Taipei (TW)

(73) Assignee: TAIWAN SEMICONDUCTOR MANUFACTURING CO., LTD.

( * ) Notice: Subject to any disclaimer, the term of this patent is extended or adjusted under 35 U.S.C. 154(b) by 0 days.

(21) Appl. No.: 16/939,784

(22) Filed: Jul. 27, 2020

(65) Prior Publication Data

US 2020/0355737 A1 Nov. 12, 2020

Related U.S. Application Data

(62) Division of application No. 15/893,466, filed on Feb. 9, 2018, now Pat. No. 10,725,090, which is a division of application No. 14/189,112, filed on Feb. 25, 2014, now Pat. No. 9,891,266.

(51) Int. Cl.
*H01Q 1/52* (2006.01)
*G01R 31/265* (2006.01)
*G01R 31/302* (2006.01)

(52) U.S. Cl.
CPC ....... *G01R 31/265* (2013.01); *G01R 31/3025* (2013.01); *H01Q 1/52* (2013.01)

(58) Field of Classification Search
CPC ..... G01R 31/265; G01R 31/3025; H01Q 1/52
See application file for complete search history.

(56) References Cited

U.S. PATENT DOCUMENTS

| | | | |
|---|---|---|---|
| 5,502,311 A | 3/1996 | Imai et al. | |
| 5,798,532 A | 8/1998 | Linehan | |
| 5,872,694 A | 2/1999 | Hoinkis et al. | |
| 7,893,878 B2 | 2/2011 | Rofougaran | |
| 7,915,903 B2 | 3/2011 | Lu et al. | |
| 8,757,501 B2 * | 6/2014 | McCormack | H01Q 1/40 235/492 |
| 8,907,693 B2 * | 12/2014 | Pagani | G01R 31/2884 324/756.03 |
| 2005/0122266 A1 | 6/2005 | Chang et al. | |

(Continued)

FOREIGN PATENT DOCUMENTS

| | | |
|---|---|---|
| TW | M255524 U | 1/2005 |
| TW | 200745572 A | 12/2007 |

(Continued)

*Primary Examiner* — Feba Pothen
(74) *Attorney, Agent, or Firm* — Cooper Legal Group, LLC

(57) ABSTRACT

A method that is disclosed that includes the operations outlined below. Dies are arranged on a test fixture, and each of the dies includes first antennas and at least one via array, wherein the at least one via array is formed between at least two of the first antennas to separate the first antennas. By the first antennas of the dies, test processes are sequentially performed on an under-test device including second antennas that positionally correspond to the first antennas, according to signal transmissions between the first antennas and the second antennas.

20 Claims, 12 Drawing Sheets

(56) References Cited

U.S. PATENT DOCUMENTS

| | | | |
|---|---|---|---|
| 2006/0125508 A1 | 6/2006 | Glidden, III et al. | |
| 2008/0073747 A1* | 3/2008 | Chao | H01L 23/585 257/520 |
| 2008/0204055 A1 | 8/2008 | Pagani | |
| 2009/0153433 A1 | 6/2009 | Nagai et al. | |
| 2010/0140758 A1* | 6/2010 | Doherty | H01L 23/481 257/659 |
| 2010/0311206 A1 | 12/2010 | Bathan et al. | |
| 2011/0267086 A1 | 11/2011 | Pagani | |
| 2012/0268153 A1 | 10/2012 | Nickel et al. | |
| 2012/0280860 A1* | 11/2012 | Kamgaing | H01Q 3/30 29/601 |
| 2013/0050055 A1 | 2/2013 | Paradiso et al. | |
| 2014/0008993 A1 | 1/2014 | Leabman | |
| 2014/0274057 A1 | 9/2014 | Pavlov | |
| 2015/0219688 A1* | 8/2015 | Jeon | G01R 31/308 702/117 |

FOREIGN PATENT DOCUMENTS

| | | |
|---|---|---|
| TW | 200845474 A | 11/2008 |
| TW | M459540 U | 8/2013 |

\* cited by examiner

TEST CIRCUIT AND METHOD

RELATED APPLICATIONS

The present application is a divisional application of the U.S. application Ser. No. 15/893,466, filed Feb. 9, 2018, now U.S. Pat. No. 10,725,090, issued Jul. 28, 2020, which is a divisional application of the U.S. application Ser. No. 14/189,112, filed Feb. 25, 2014, now U.S. Pat. No. 9,891,266, issued Feb. 13, 2018. U.S. application Ser. No. 15/893,466 and U.S. application Ser. No. 14/189,112 are herein incorporated by reference.

BACKGROUND

During the manufacturing process of integrated circuits, various tests are performed at one or more stages to ensure that a finished product functions adequately. Parts of the tests are performed by feeding signal from a test fixture to an under-test device. In operation, the under-test device is placed to be aligned with the test fixture, and is tested by the signals transmitted by the test fixture.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
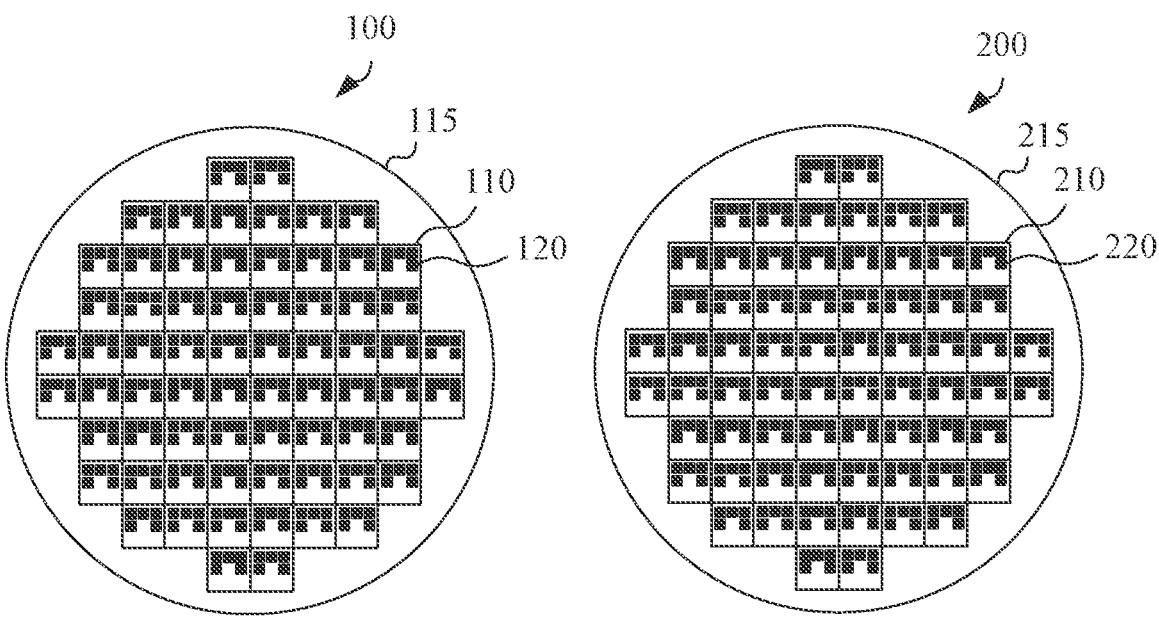
FIG. 1A is a diagram of a top view of a test fixture and an under-test device in accordance with various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1B:
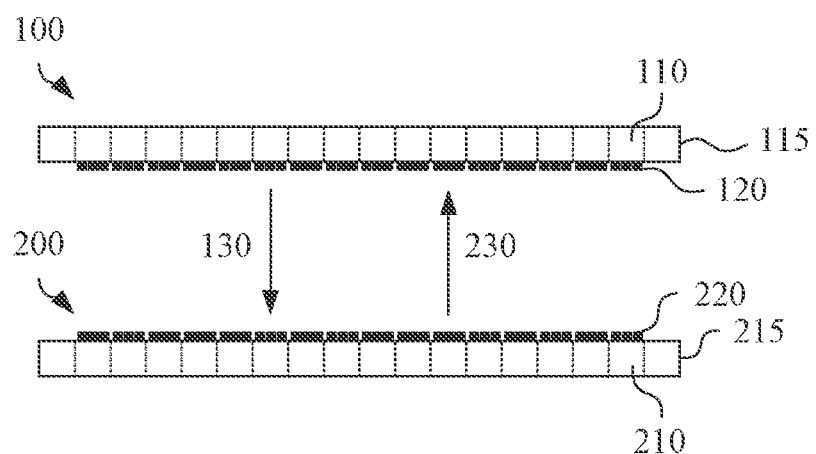
FIG. 1B is a side view of the test fixture and the under-test device in accordance with various embodiments of the present disclosure.

FIG. 1A is a diagram of a top view of a test fixture 100 and an under-test device 200 in accordance with various embodiments of the present disclosure. FIG. 1B is a side view of the test fixture 100 and the under-test device 200 in accordance with various embodiments of the present disclosure, in which the test fixture 100 is placed above the under-test device 200.

The test fixture 100 includes a plurality of dies 110. In some embodiments, the dies 110 are formed on a printed circuit board (PCB) 115. Each of the dies 110 includes a plurality of antennas 120.

In some embodiments, the under-test device 200 includes a wafer layer 215 that includes a plurality of under-test dies 210. Each of the under-test dies 210 includes a plurality of antennas 220. In further embodiments, each of the under-test dies 210 further includes a circuit (not illustrated) that the antennas 220 are formed thereon.

In some embodiments, the dies 110 are arranged in an array and positionally correspond to the under-test dies 210. Further, each of the antennas 120 positionally corresponds to one of the second antennas 220.

The antennas 120 perform signal transmissions with the antennas 220 to perform test processes. More specifically, the test processes are performed according to the transmissions of forced signals 130 and feedback signals between the antennas 120 and the antennas 220.

For illustration with reference to FIG. 1A and FIG. 1B, the antennas 120 first transmit the forced signals 130 to the antennas 220. In some embodiments, the test fixture 100 is a wireless probe card that is connected to a test equipment (not illustrated). The forced signals 130 transmitted by the antennas 120 are generated by the test equipment.

In some embodiments, the circuits in the under-test dies 210 generates the feedback signals 230 in response to the forced signals 130 received by the antennas 220. For illustration, the antennas 120 receive the feedback signals 230 from the antennas 220.

In some embodiments, the feedback signals 230 are further transmitted from the test fixture 100 to the test equipment. The test equipment determines whether the circuits in the under-test dies 210 function normally according to the feedback signals 230.

Figure 2A:
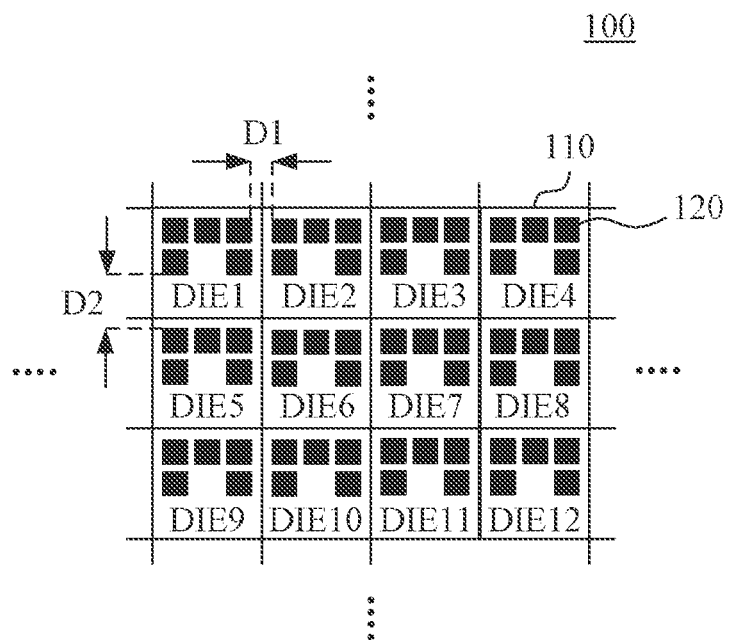
FIG. 2A is a partially enlarged view of the test fixture in accordance with various embodiments of the present disclosure.

FIG. 2A is a partially enlarged view of the test fixture 100 in accordance with various embodiments of the present disclosure. For illustration, the dies 110 labeled as DIE1, DIE2, . . . and DIE12 are illustrated.

In some embodiments, the dies 110 labeled as DIE1, DIE5 and DIE9 are disposed in one of a plurality of odd columns of the array. The dies 110 labeled as DIE2, DIE6 and DIE10 are disposed in one of a plurality of even columns of the array. The dies 110 labeled as DIE3, DIE7 and DIE11 are disposed in another one of the odd columns of the array. The dies 110 labeled as DIE4, DIE8 and DIE12 are disposed in another one of the even columns of the array.

Figure 2B:
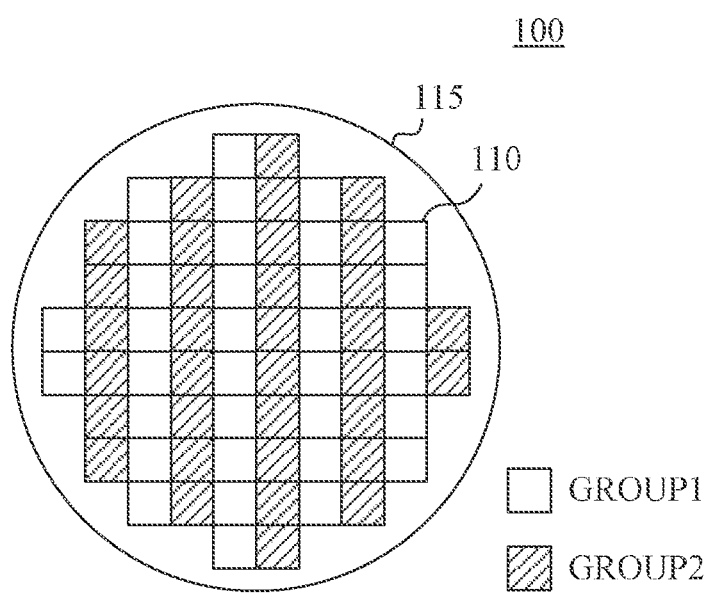
FIG. 2B is a simplified top view of the test fixture in accordance with various embodiments of the present disclosure.

FIG. 2B is a simplified top view of the test fixture 100 in accordance with various embodiments of the present disclosure, in which the antennas 120 are not illustrated in FIG. 2B. For illustration, the dies 110 are categorized into two die groups GROUP1 and GROUP2.

Figure 3:
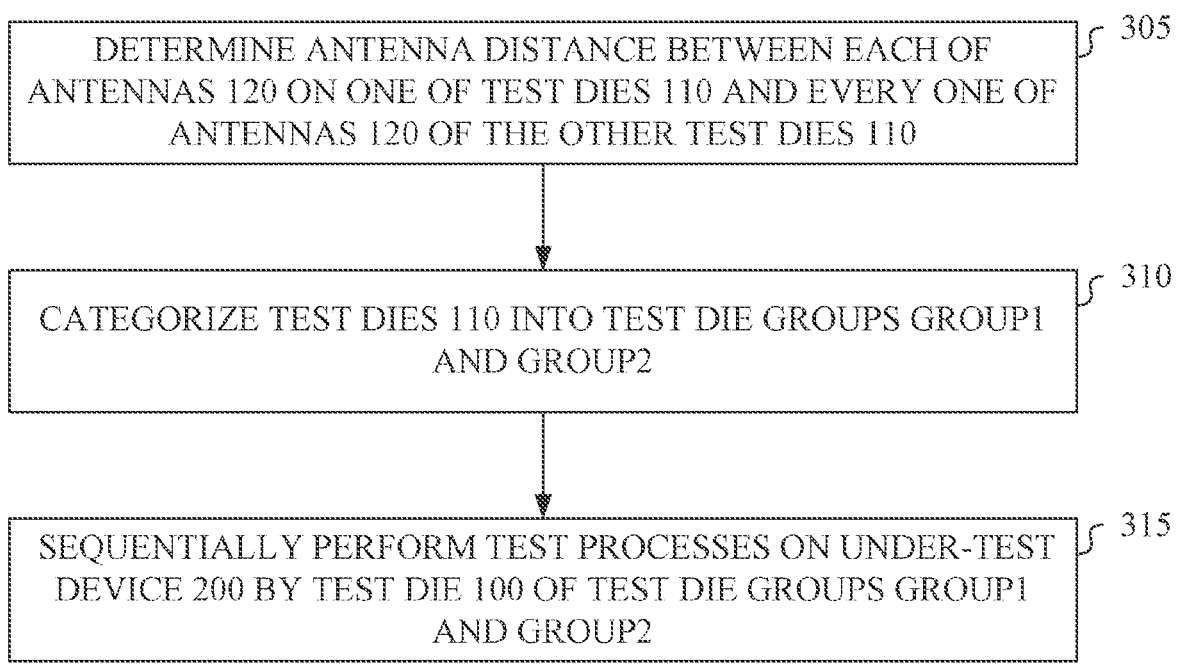
FIG. 3 is an exemplary diagram of an operation method in accordance with various embodiments of the present disclosure.

FIG. 3 is an exemplary diagram of an operation method 300 in accordance with various embodiments of the present disclosure. In some embodiments, the operation method 300 is applied to the test fixture 100 illustrated in FIG. 2A and FIG. 2B. For illustration, operations of the test fixture 100 are described by the operation method 300 with reference to FIG. 2A and FIG. 2B.

In operation 305, an antenna distance between each of the antennas 120 on one of the dies 110 and every one of the antennas 120 of the other dies 110 is determined.

For illustration, the distance between one of the antennas 120 of the die labeled as DIE1 and one of the antennas 120 of the die labeled as DIE2 is determined to be D1. The distance between one of antenna 120 of the die labeled as DIE1 and one of the antenna 120 of the die labeled as DIE5 is determined to be D2.

In operation 310, the dies 110 are categorized into a plurality of die groups.

For illustration in FIG. 2B, the dies 110 are categorized into the die groups GROUP1 and GROUP2. The die group GROUP1 corresponds to the odd columns of the array, and the die group GROUP2 corresponds to the even columns of the array.

For illustration, the dies 110 in the die group GROUP1 are illustrated as white blocks. The dies 110 in the die group GROUP2 are illustrated as patterned blocks.

Between each of the antennas 120 of one of the dies 110 in the die group GROUP1 and every one of the antennas 120 of the other dies 110 in the die group GROUP1, the antenna distance therebetween is larger than an interference threshold.

For illustration in FIG. 2A, the dies DIE1, DIE3, DIE5, DIE7, DIE9 and DIE11 are in the die group GROUP1 since they are disposed in two of the odd columns. As a result, the antenna distance between each of the antennas 120 of the die DIE1 and every one of the antennas 120 of the other dies, e.g., DIE5, DIE9, DIE3, DIE7 and DIE11, is larger than the interference threshold.

Similarly, between each of the antennas 120 of one of the dies 110 in the die group GROUP2 and every one of the antennas 120 of the other dies 110 in the die group GROUP2, the antenna distance therebetween is larger than an interference threshold.

For illustration in FIG. 2A, the dies DIE2, DIE4, DIE6, DIE8, DIE10 and DIE12 are in the die group GROUP2 since they are disposed in two of the even columns. As a result, the antenna distance between each of the antennas 120 of the die DIE2 and every one of the antennas 120 of the other dies, e.g. DIE6, DIE10, DIE4, DIE8 and DIE12, is larger than the interference threshold.

On the other hand, when the antenna distance between any two of the antennas 120 from two of the dies 110 is smaller than the interference threshold, the two dies 110 are not categorized in the same die group. For example, the antenna distance of some pairs of the antennas 120 from both of the dies DIE1 and DIE2 is smaller than the interference threshold. As a result, the dies DIE1 and DIE2 are not categorized in the same die group.

In some embodiments, the interference threshold is in a range of five to ten times of the wavelength of the signals transmitted by the antennas 120 and 220. For example, if the wavelength of the signals transmitted by the antennas 120 and 220 is 100 micrometers, the interference threshold is within a range from about 500 micrometers to 1000 micrometers. When the antenna distance between two of the antennas 120 is larger than the interference threshold, the interference generated therebetween is decreased.

In operation 315, a plurality of test processes are sequentially performed on the under-test device 200 by the antennas 120 of the dies 110 of the die groups GROUP1 and GROUP2. Each of the test processes is performed according to signal transmissions between the antennas 120 and the second antennas 220.

In some embodiments, the test process corresponding to the die group GROUP1 is performed first, and the test process corresponding to the die group GROUP2 is performed subsequently. In some embodiments, the test process corresponding to the die group GROUP2 is performed first, and the test process corresponding to the die group GROUP1 is performed subsequently.

Based on the operations, the test fixture 100 performs the test processes sequentially to avoid the interference between the geometrically crowded antennas 120. As a result, even the under-test dies 210 and the dies 110 are manufactured with a high density, the interference of the antennas 120 between the dies is prevented. In some embodiments, the distance between each of two of the adjacent under-test dies 210 or each two of the adjacent dies 110 equals to the width of the scribe line formed therebetween. In some embodiments, the scribe line is within a range from about 80 micrometers to about 200 micrometers.

Figure 4A:
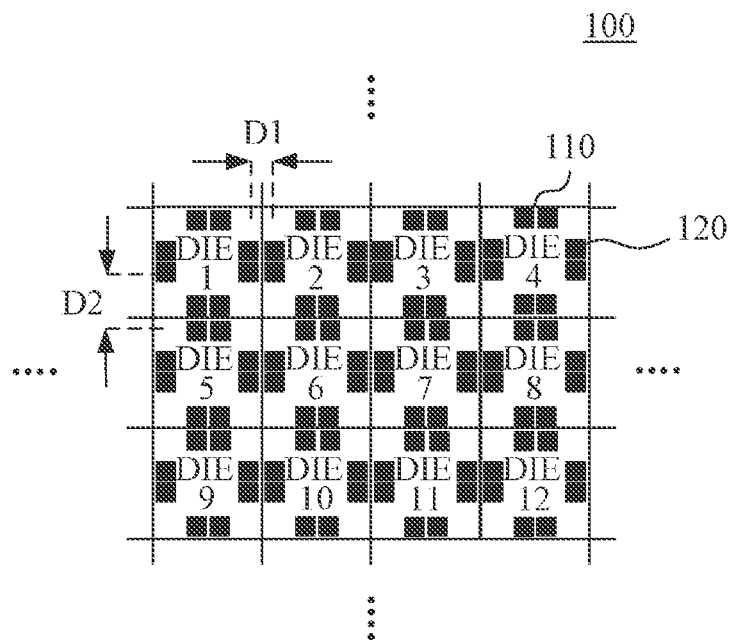
FIG. 4A is a partially enlarged view of the test fixture in accordance with various embodiments of the present disclosure.

FIG. 4A is a partially enlarged view of the test fixture 100 in accordance with various embodiments of the present disclosure. For illustration in FIG. 4A, the dies 110 labeled as DIE1, DIE2, ... and DIE12 are illustrated.

In some embodiments, the dies 110 labeled as DIE1, DIE3, DIE9 and DIE11 are disposed in an intersection of one of the odd columns and one of the odd rows of the array respectively. The dies 110 labeled as DIE6 and DIE8 are disposed in an intersection of one of the even columns and one of the even rows of the array respectively. The dies 110 labeled as DIE2, DIE4, DIE10 and DIE12 are disposed in one of the even columns and one of the odd rows of the array respectively. The dies 110 labeled as DIE5 and DIE7 are disposed in one of the odd columns and one of the even rows of the array respectively.

Figure 4B:
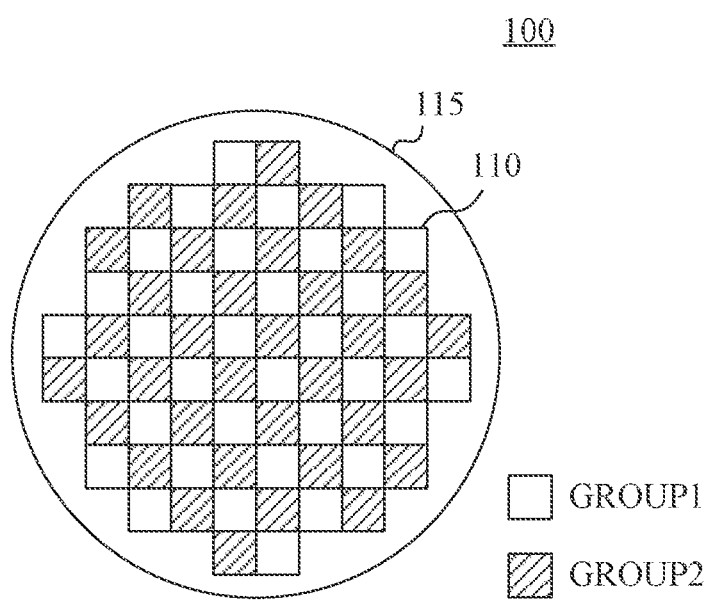
FIG. 4B is a simplified top view of the test fixture in accordance with various embodiments of the present disclosure.

FIG. 4B is a simplified top view of the test fixture 100 in accordance with various embodiments of the present disclosure, in which the antennas 120 are not illustrated in FIG. 4B. For illustration, the dies 110 are categorized into two die groups GROUP1 and GROUP2.

The die group GROUP1 corresponds to the dies 110 each located at the intersection of one of the odd columns and one of the odd rows of the array, and the dies 110 each located at the intersection of one of the even columns and one of the even rows of the array. The die group GROUP2 corresponds to the dies 110 each located at the intersection of one of the even columns and one of the odd rows of the array, and the dies 110 each located at the intersection of one of the odd columns and one of the even rows of the array.

Though the density of the antennas 120 is higher than that of the antennas 120 illustrated in FIG. 2A, the antenna distance between each two of the antennas 120 of two obliquely adjacent dies 110 is still larger than the interference threshold. As a result, the dies 110 in the die groups GROUP1 and GROUP2 alternate to each other to form a chequered pattern. The test processes are performed sequentially by the die groups GROUP1 and GROUP2 to prevent the interference.

Figure 5:
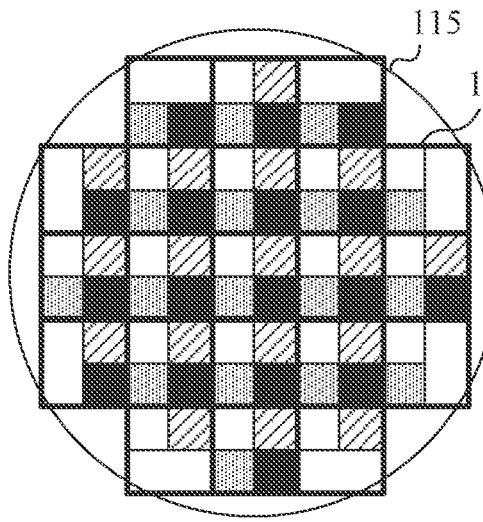
FIG. 5 is a simplified top view of the test fixture in accordance with various embodiments of the present disclosure.

FIG. 5 is a simplified top view of the test fixture 100 in accordance with various embodiments of the present disclosure, in which the antennas 120 are not illustrated in FIG. 5.

For illustration in FIG. 5, the dies 110 are covered by a plurality of 2×2 windows illustrated by thick lines. Each of the 2×2 windows includes at most four of the dies 110. The dies 110 are categorized into four die groups GROUP1, GROUP2, GROUP3 and GROUP4. Each of the four die groups GROUP1-GROUP4 includes one of the dies 110 in each of the 2×2 windows that are in the same position of the 2×2 windows.

Under such a condition, between each of the antennas 120 of one of the dies 110 in one of the die groups and every one of the antennas 120 of the other dies 110 in the same die groups, the antenna distance is guaranteed to be larger than the interference threshold. Since each of the test processes is not performed by any two of the adjacent antennas, the condition of severe interference of the antennas is avoided.

Figure 6:
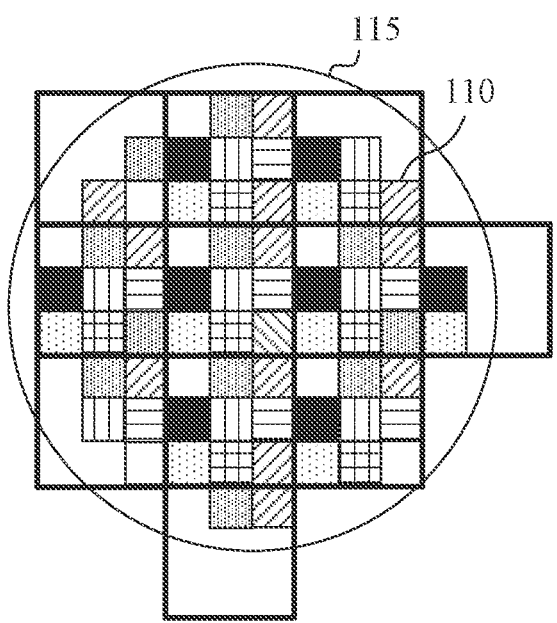
FIG. 6 is a simplified top view of the test fixture in accordance with various embodiments of the present disclosure.

FIG. 6 is a simplified top view of the test fixture 100 in accordance with various embodiments of the present disclosure, in which the antennas 120 are not illustrated in FIG. 6.

For illustration in FIG. 6, the dies 110 are covered by a plurality of 3×3 windows illustrated by thick lines. Each of the 3×3 windows includes at most nine of the dies 110. The dies 110 are further categorized into nine die groups GROUP1, GROUP2, GROUP3, GROUP4, GROUP5, GROUP6, GROUP7, GROUP8 and GROUP9. Each of the nine die groups GROUP1-GROUP9 includes one of the dies 110 in each of the 3×3 windows that are in the same position of the 3×3 windows.

Under such a condition, between each of the antennas 120 of one of the dies 110 in one of the die groups and every one of the antennas 120 of the other dies 110 in the same die groups, the antenna distance is guaranteed to be larger than the interference threshold. Since each of the test processes is not performed by any two of the adjacent antennas, the condition of severe interference of the antennas is avoided.

Figure 7:
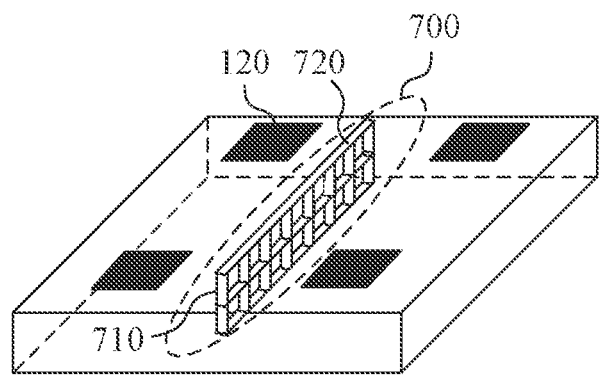
FIG. 7 is a three-dimensional (3-D) diagram of one of the dies in accordance with various embodiments of the present disclosure.

FIG. 7 is a three-dimensional (3-D) diagram of one of the dies 110 in accordance with various embodiments of the present disclosure.

For illustration, the die 110 includes four antennas 120 and a via array 700. The via array 700 separates two of the antennas 120 from the other two of the antennas 120. In some embodiments, the via array 700 includes a plurality of vias 710. In some embodiments, the via array 700 further includes at least one shielding plane 720 stretching to connect the vias 710. For illustration in FIG. 7, the via array 700 includes three shielding planes 720.

In some embodiments, the via array 700 includes an electric-shielding material. In some embodiments, the electric-shielding material is metal. In further embodiments, the material of the via array 700 is copper.

In some approaches, when the antenna distance between the antennas 120 in a single die 110 is small, the interference between the antennas 120 occurs.

Compared to the preceding approaches, in the present disclosure, the via array 700 is disposed to provide a one-dimensional shielding effect. The interference between the antennas 120 in one side of the via array 700 and the other side of the via array 700 is prevented.

Figure 8:
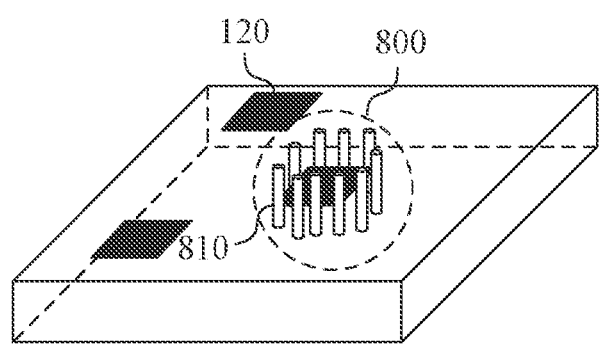
FIG. 8 is a three-dimensional diagram of one of the dies in accordance with various embodiments of the present disclosure.

FIG. 8 is a three-dimensional diagram of one of the dies 110 in accordance with various embodiments of the present disclosure.

For illustration, the die 110 includes three antennas 120 and a via array 800. The via array 800 includes a plurality of vias 810. Moreover, the via array 800 is formed to surround one of the antennas 120.

As a result, the via array 800 provides a two-dimensional shielding effect to prevent the surrounded antenna 120 from interference. The interference from the environment that the surrounded antenna 120 locates is prevented by the via array 800.

Figure 9A:
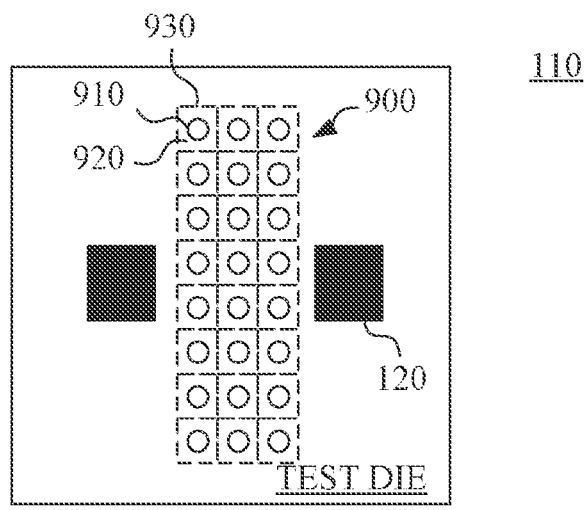
FIG. 9A, FIG. 9B and FIG. 9C are top vias of one of the dies in the test fixture in accordance with various embodiments of the present disclosure.
Figure 9B:
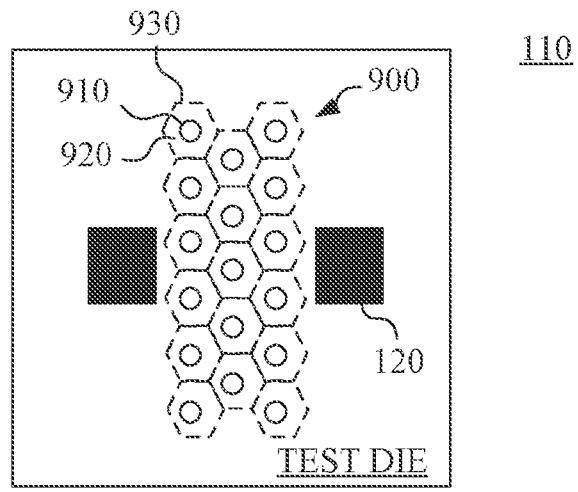
Figure 9C:
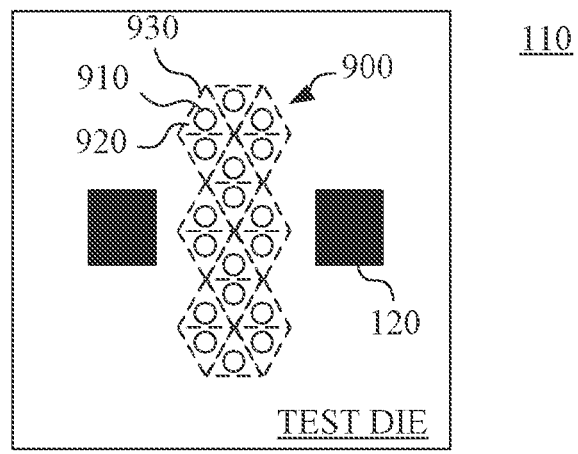

FIG. 9A, FIG. 9B and FIG. 9C are top vias of one of the dies 110 in the test fixture 100 in accordance with various embodiments of the present disclosure.

For illustration, the die 110 illustrated in FIG. 9A, FIG. 9B and FIG. 9C includes two antennas 120 and a via array 900. The via array 900 includes a plurality of vias 910. Moreover, the via array 900 is formed to separate the two antennas 120.

In some embodiments, each of the vias 910 and a corresponding surrounding region 920 form a via cell 930. In some embodiments, each of the via cells 930 is a square shape, as illustrated in FIG. 9A. In some embodiments, each of the via cells 930 is a hexagonal shape, as illustrated in FIG. 9B. In some embodiments, each of the via cells 930 is a rhombic shape, as illustrated in FIG. 9C.

Based on different shapes of the via cells 930, different arrangements and densities of the via array 900 are accomplished. As a result, different interference conditions of the antennas 120 are addressed by using different shapes of the via cells 930. In some embodiments, the shapes of the via cells illustrated in FIG. 9A, FIG. 9B and FIG. 9C are applied to the vias 810 of the via array 800. More specifically, different shapes of the via cells are used in the via array 800 to surround the antenna 120.

Figure 10:
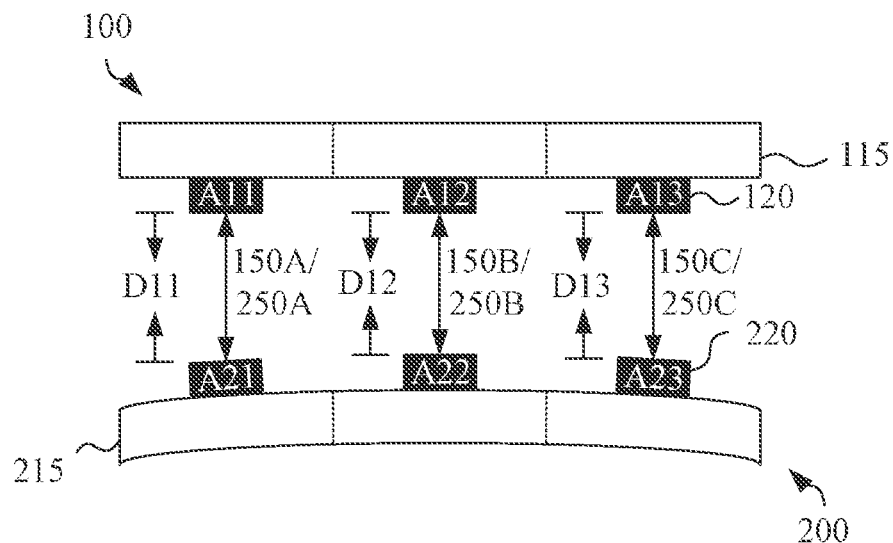
FIG. 10 is a simplified side view of the test fixture and the under-test device in accordance with various embodiments of the present disclosure.

FIG. 10 is a simplified side view of the test fixture 100 and the under-test device 200 in accordance with various embodiments of the present disclosure, in which the test fixture 100 is placed above the under-test device 200.

For illustration, the test fixture 100 includes a plurality of antennas 120 labeled as A11, A12 and A13. In some embodiments, the antennas 120 are formed on a planar surface of the test fixture 100.

The under-test device 200 includes the wafer layer 215. For illustration, the wafer layer 215 includes a plurality of antennas 220 labeled as A21, A22 and A23.

For illustration, the distance between the antenna 220 labeled as A21 and the antenna 120 labeled as A11 is D11. The distance between the antenna 220 labeled as A22 and the antenna 120 labeled as A12 is D12. The distance between the antenna 220 labeled as A23 and the antenna 120 labeled as A13 is D13.

Figure 11:
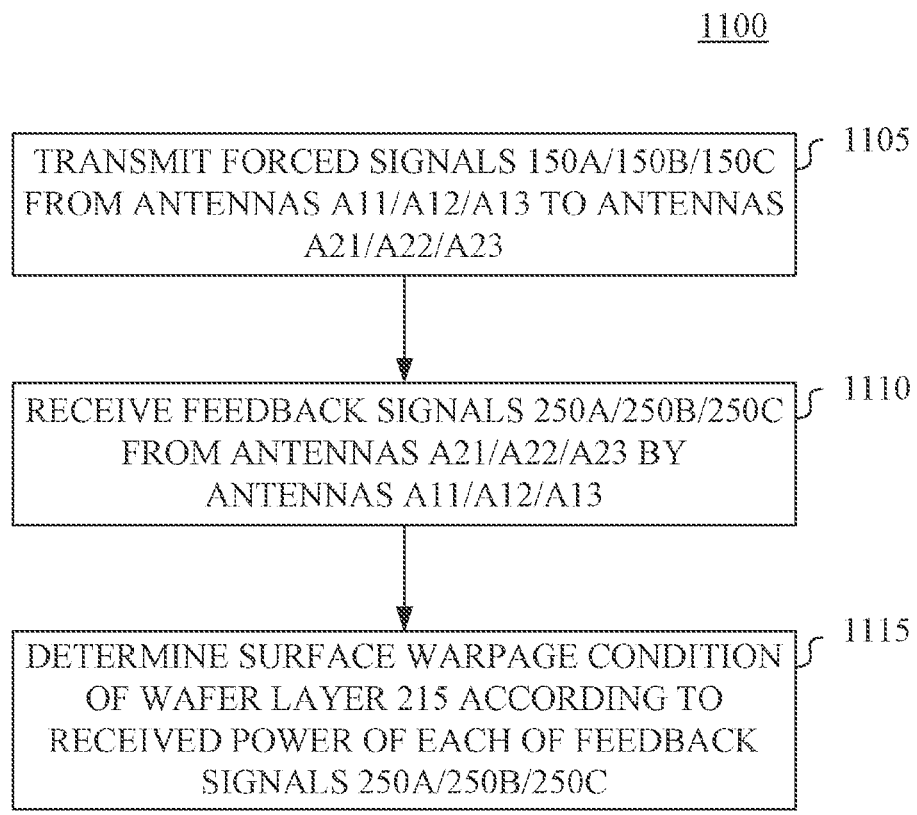
FIG. 11 is an exemplary diagram of an operation method in accordance with various embodiments of the present disclosure.

FIG. 11 is an exemplary diagram of an operation method 1100 in accordance with various embodiments of the present disclosure. In some embodiments, the operation method 1100 is applied to the test fixture 100 illustrated in FIG. 10. For illustration, operations of the test fixture 100 are described by the operation method 1100 with reference to FIG. 10.

In operation 1105, forced signals 150A, 150B and 150C are transmitted from the antennas 120 of the test fixture 100 to the antennas 220 of the wafer layer 215.

For illustration, the forced signal 150A is transmitted from the antenna 120 labeled as A11 to the antenna 220 labeled as A21. The forced signal 150B is transmitted from the antenna 120 labeled as A12 to the antenna 220 labeled as A22. The forced signal 150C is transmitted from the antenna 120 labeled as A13 to the antenna 220 labeled as 23.

In operation 1110, feedback signals 250A, 250B and 250C are received from the antennas 220 by the antennas 120.

For illustration, the feedback signal 250A is received from the antenna 220 labeled as A21 by the antenna 120 labeled as A11. The feedback signal 250B is received from the antenna 220 labeled as A22 by the antenna 120 labeled as A12. The feedback signal 250C is received from the antenna 220 labeled as A23 by the antenna 120 labeled as A13.

In operation 1115, a surface warping condition of the wafer layer 215 is determined according to a received power of each of the feedback signals 250A, 250B and 250C.

For illustration, when the received power of the feedback signal 250B is larger than that of the feedback signal 250A, the distance D12 is determined to be shorter than the distance D11. Similarly, when the received power of the feedback signal 250B is larger than that of the feedback signal 250C, the distance D12 is determined to be shorter than the distance D13.

As a result, the distance D12 corresponding to the antenna 220 labeled as A22 is determined to be shorter than the distances D11 and D13 corresponding to the antennas 220 labeled as A21 and A23. The surface warping condition of the wafer layer 215 is determined to be a "cry" case. Explained in a different way, the two sides of the wafer layer 215 are bent away from the test fixture 100.

In some embodiments, different surface warping conditions are determined according to different combinations of the received power of the feedback signals. A "smile" case is determined when the distance D12 is determined to be longer than the distances D11 and D13. Explained in a different way, the two sides of the wafer layer 215 are bent toward the test fixture 100. Moreover, a planar case is determined when the distance D12 is determined to equal to the distances D11 and D13.

Figure 12:
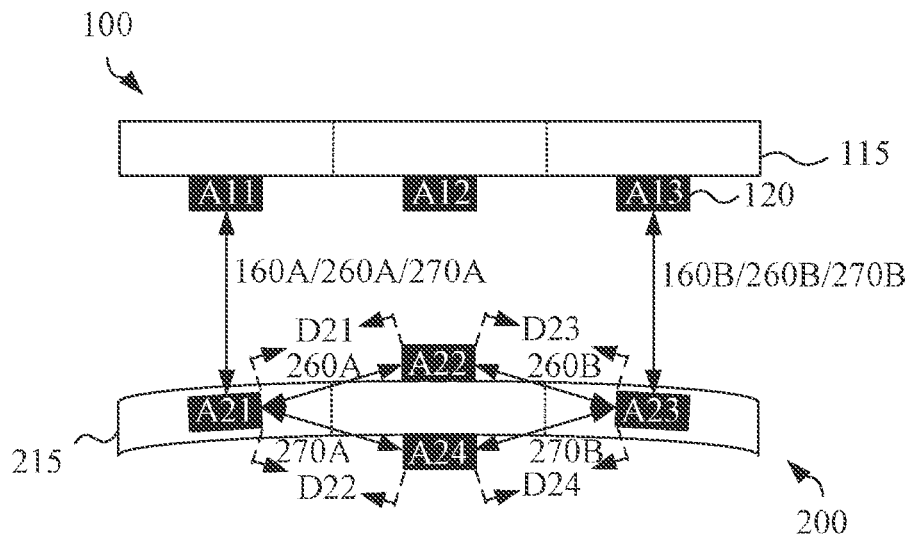
FIG. 12 is a simplified side view of the test fixture and the under-test device in accordance with various embodiments of the present disclosure.

FIG. 12 is a simplified side view of the test fixture 100 and the under-test device 200 in accordance with various embodiments of the present disclosure, in which the test fixture 100 is placed above the under-test device 200.

The test fixture 100 and the under-test device 200 substantially include the same components as those of the test fixture 100 and the under-test device 200 illustrated in FIG. 10. Compared with the under-test device 200 illustrated in FIG. 10, the antennas 220 labeled as A21 and A23 are formed inside of the wafer layer 215. Moreover, the under-test device 200 illustrated in FIG. 12 further includes an antennas 220 labeled as A24.

For illustration, the antennas 220 labeled as A21 and A23 are symmetrically distributed to surround the antennas 220 labeled as A22 and A24. For illustration, the distance between the antenna 220 labeled as A21 and the antenna 220 labeled as A22 is D21. The distance between the antenna 220 labeled as A21 and the antenna 220 labeled as A24 is D22. The distance between the antenna 220 labeled as A23 and the antenna 220 labeled as A22 is D23. The distance between the antenna 220 labeled as A23 and the antenna 220 labeled as A24 is D24.

Figure 13:
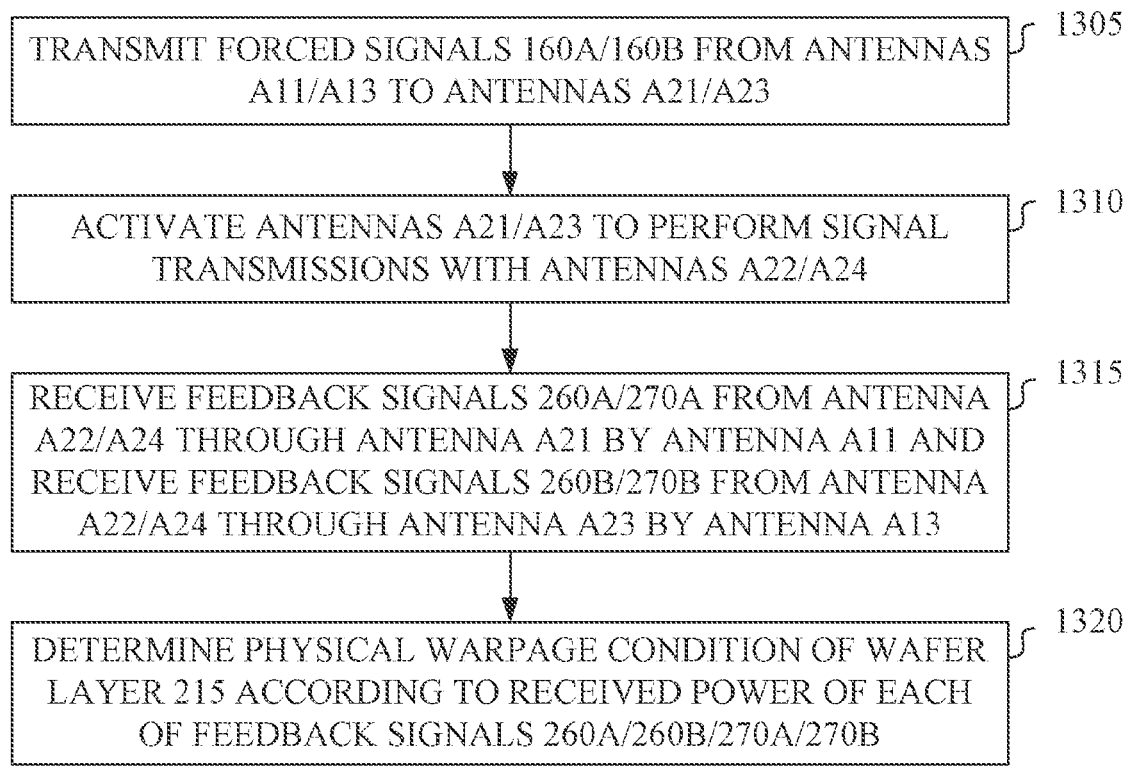
FIG. 13 is an exemplary diagram of an operation method in accordance with various embodiments of the present disclosure.

FIG. 13 is an exemplary diagram of an operation method 1300 in accordance with various embodiments of the present disclosure. In some embodiments, the operation method 1300 is applied to the test fixture 100 illustrated in FIG. 12. For illustration, operations of the test fixture 100 are described by the operation method 1300 with reference to FIG. 12.

In operation 1305, forced signals 160A and 160B are transmitted from the antennas 120 of the test fixture 100 to the antennas 220 of the wafer layer 215.

For illustration, the forced signal 160A is transmitted from the antenna 120 labeled as A11 to the antenna 220 labeled as A21. The forced signal 160B is transmitted from the antenna 120 labeled as A13 to the antenna 220 labeled as A23.

In operation 1310, the antennas 220 labeled as A21 and A23 are activated to perform signal transmissions with the antennas 220 labeled as A22 and A24.

In operation 1315, feedback signals 260A and 270A are received by the antennas 120 labeled as A11 from the antennas 220 labeled as A22 and A24 through the antenna 220 labeled as A21. Feedback signals 260B and 270B are received by the antennas 120 labeled as A13 from the antennas 220 labeled as A22 and A24 through the antenna 220 labeled as A23.

In operation 1320, a physical warping condition of the wafer layer 215 is determined according to a received power of each of the feedback signals 260A, 260B, 270A and 270B.

For illustration, when the received power of the feedback signal 270A is larger than that of the feedback signal 260A, the distance D22 is determined to be shorter than the distance D21. Similarly, when the received power of the feedback signal 270B is larger than that of the feedback signal 260B, the distance D24 is determined to be shorter than the distance D23.

As a result, the physical warping condition of the wafer layer 215 is determined to be a "cry" case. Explained in a different way, the two sides of the wafer layer 215 are bent away from the test fixture 100.

In some embodiments, different physical warping conditions are determined according to different combinations of the received power of the feedback signals. A "smile" case is determined when the distances D21 and D23 are determined to be longer than the distances D22 and D24 respectively. Explained in a different way, the two sides of the wafer layer 215 are bent toward the test fixture 100. Moreover, a planar case is determined when the distances D21 and D23 are determined to equal to the distances D22 and D24 respectively.

Figure 14:
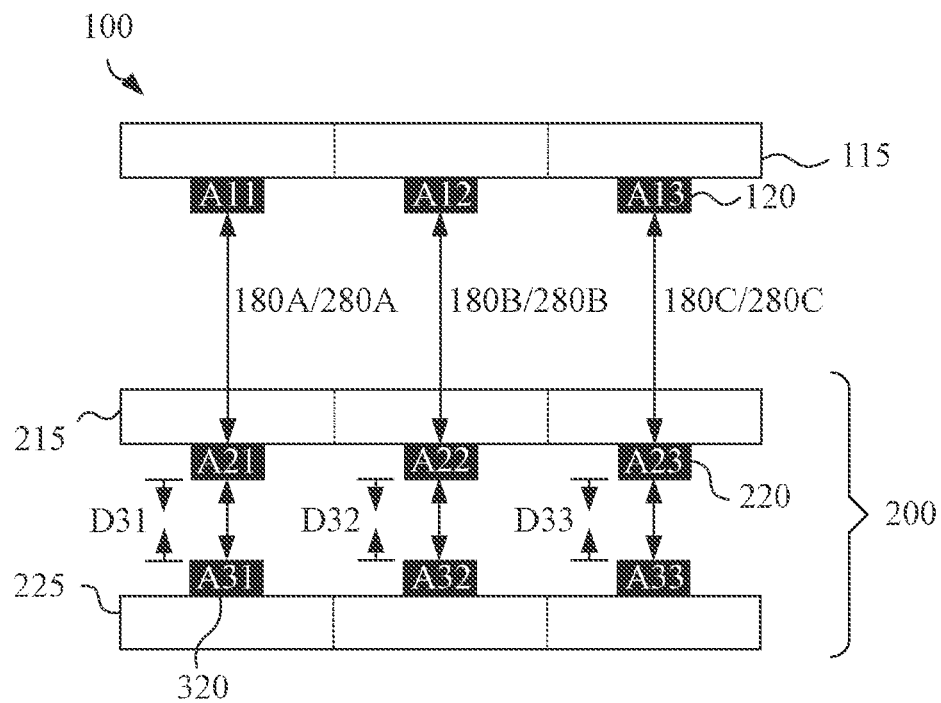
FIG. 14 is a simplified side view of the test fixture and the under-test device in accordance with various embodiments of the present disclosure.

FIG. 14 is a simplified side view of the test fixture 100 and the under-test device 200 in accordance with various embodiments of the present disclosure, in which the test fixture 100 is placed above the under-test device 200.

The test fixture 100 substantially includes the same components as those of the test fixture 100 illustrated in FIG. 10.

In some embodiments, the under-test device 200 is a three-dimensional integrated circuit. The under-test device 200 includes two wafer layers 215 and 225.

For illustration, the wafer layer 215 includes a plurality of antennas 220 labeled as A21, A22 and A23. The antennas 220 labeled as A21, A22 and A23 are formed in the surface of the wafer layer 215 opposite to the test fixture 100.

For illustration, the wafer layer 225 includes a plurality of antennas 320 labeled as A31, A32 and A33. For illustration, the distance between the antenna 320 labeled as A31 and the antenna 220 labeled as A21 is D31. The distance between the antenna 320 labeled as A32 and the antenna 220 labeled as A22 is D32. The distance between the antenna 320 labeled as A33 and the antenna 220 labeled as A23 is D33.

Figure 15:
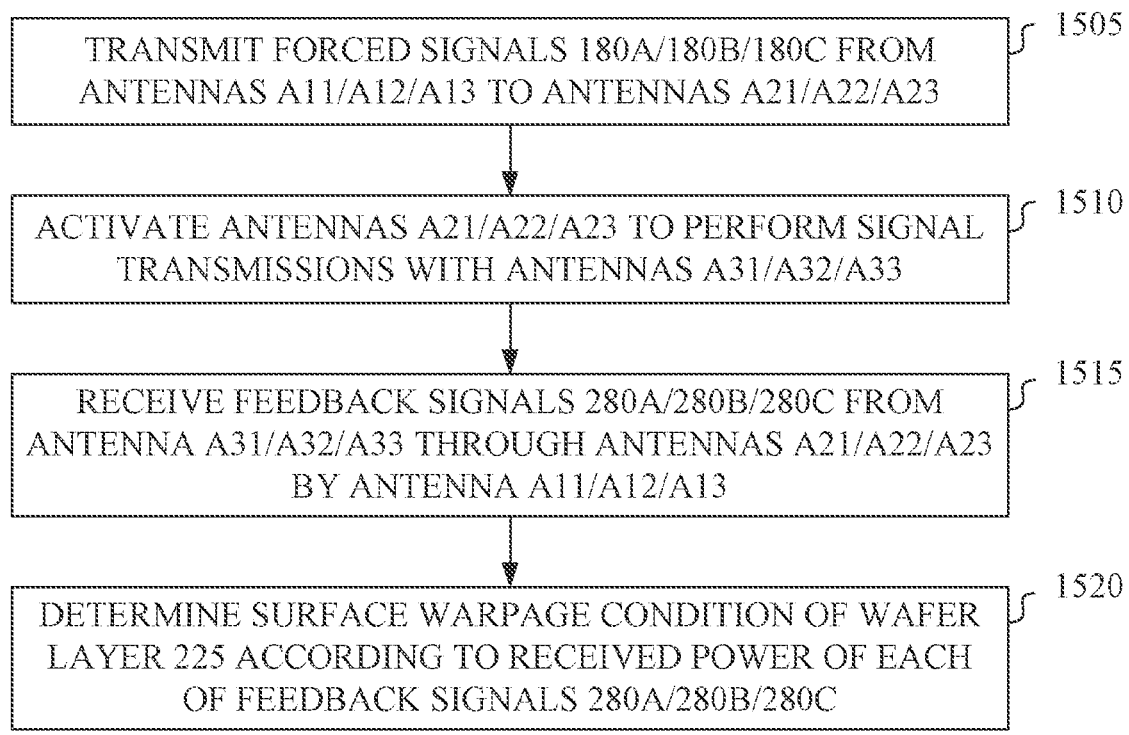
FIG. 15 is an exemplary diagram of an operation method in accordance with various embodiments of the present disclosure.

FIG. 15 is an exemplary diagram of an operation method 1500 in accordance with various embodiments of the present disclosure. In some embodiments, the operation method 1500 is applied to the test fixture 100 illustrated in FIG. 14. For illustration, operations of the test fixture 100 are described by the operation method 1300 with reference to FIG. 14.

In operation 1505, forced signals 180A, 180B and 180C are transmitted from the antennas 120 of the test fixture 100 to the antennas 220 of the wafer layer 215.

For illustration, the forced signal 180A is transmitted from the antenna 120 labeled as A11 to the antenna 220 labeled as A21. The forced signal 180B is transmitted from the antenna 120 labeled as A12 to the antenna 220 labeled as A22. The forced signal 180C is transmitted from the antenna 120 labeled as A13 to the antenna 220 labeled as A23.

In operation 1510, the antennas 220 labeled as A21, A22 and A23 are activated to perform signal transmissions with the antennas 320.

For illustration, the antennas 220 labeled as A21 performs signal transmission with the antenna 320 labeled as A31. The antennas 220 labeled as A22 performs signal transmission with the antenna 320 labeled as A32. The antennas 220 labeled as A23 performs signal transmission with the antenna 320 labeled as A33.

As a result, each two of the corresponding antennas in the wafer layers 215 and 225 forms a signal transmission chain.

In operation 1515, feedback signals 280A, 280B and 280C are received by the antennas 120 from the antennas 320 through the antennas 220. Explained in a different way, each of the feedback signals 280A, 280B and 280C is received by the antennas through the corresponding signal transmission chain.

For illustration, the feedback signal 280A is received by the antennas 120 labeled as A11 from the antennas 320 labeled as A31 through the antennas 220 labeled as A21. The feedback signal 280B is received by the antennas 120 labeled as A12 from the antennas 320 labeled as A32 through the antennas 220 labeled as A22. The feedback signal 280C is received by the antennas 120 labeled as A13 from the antennas 320 labeled as A33 through the antennas 220 labeled as A23.

In operation 1520, a surface warping condition of the wafer layer 225 is determined according to a received power of each of the feedback signals 280A, 280B and 280C.

For example, when the received power of the feedback signal 280B is larger than that of the feedback signal 280A, the distance D32 is determined to be shorter than the distance D31. Similarly, when the received power of the feedback signal 280B is larger than that of the feedback signal 280C, the distance D32 is determined to be shorter than the distance D33.

As a result, in the three-dimensional circuit, the corresponding antennas in different wafer layers form signal transmission chains. By forcing the forced signal, the signal transmission chains are activated. The feedback signals are received from the under-test layer through the signal transmission chains. The surface warping condition of the wafer layers under a top wafer layer is determined.

In some embodiments, the operations illustrated in FIG. 11, FIG. 13 and FIG. 15 are performed sequentially. For example, when the surface warping condition of the wafer layer 215 is determined to be planar, the physical warping condition of the wafer layer 215 is determined subsequently. Moreover, when the physical warping condition of the wafer layer 215 is determined to be planar, the surface warping condition of the wafer layer 225 is determined subsequently.

Figure 16:
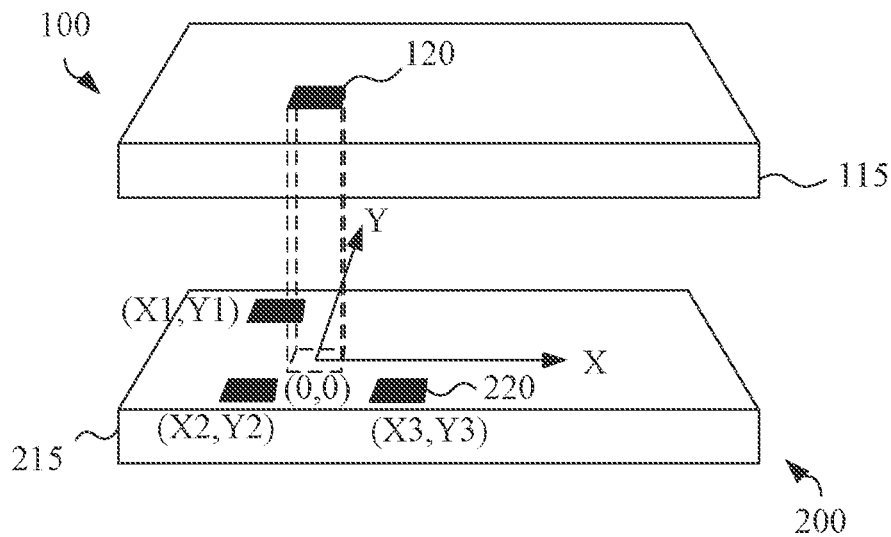
FIG. 16 is a three-dimensional diagram of test fixture and the under-test device in accordance with various embodiments of the present disclosure.

FIG. 16 is a three-dimensional diagram of test fixture 100 and the under-test device 200 in accordance with various embodiments of the present disclosure, in which the test fixture 100 is placed above the under-test device 200.

The test fixture 100 substantially includes the same components as those of the test fixture 100 illustrated in FIG. 10, in which only one antenna 120 is exemplary illustrated in FIG. 16. For illustration, the projection of the antenna 120 on the under-test device 200 serves as an origin and has a coordinate of (0,0).

The under-test device 200 substantially includes the same components as those of the under-test device 200 illustrated in FIG. 10. Compared with the under-test device 200 illustrated in FIG. 10, the antennas 220 are arranged to have the coordinates of (X1, Y1), (X2, Y2) and (X3, Y3) relative to the origin respectively.

Figure 17:
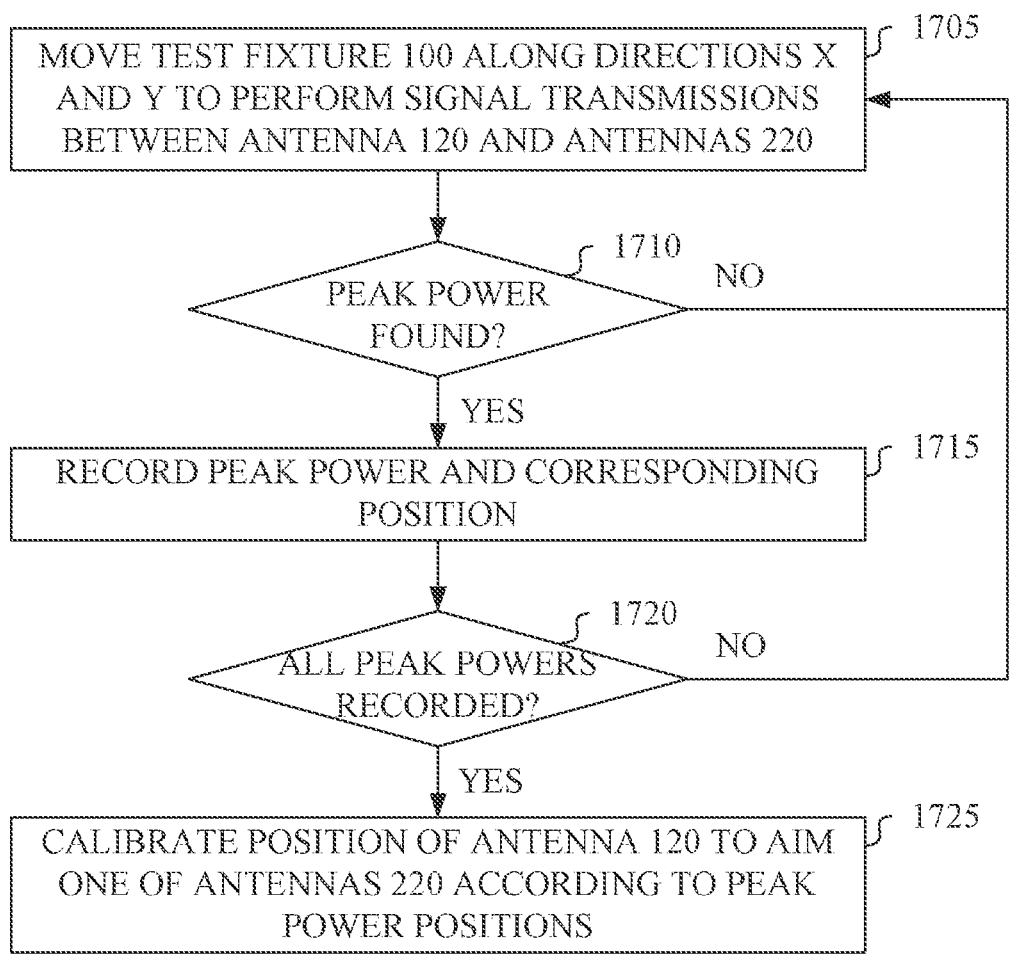
FIG. 17 is an exemplary diagram of an operation method in accordance with various embodiments of the present disclosure.

FIG. 17 is an exemplary diagram of an operation method 1700 in accordance with various embodiments of the present disclosure. In some embodiments, the operation method 1700 is applied to the test fixture 100 illustrated in FIG. 16. For illustration, operations of the test fixture 100 are described by the operation method 1700 with reference to FIG. 16.

In operation 1705, the test fixture 100 is moved along a direction X and a direction Y to perform signal transmissions between the antenna 120 and the antennas 220.

In operation 1710, whether a power peak is found is determined. Operation 1710 is explained with reference to FIG. 18A and FIG. 18B illustrated below.

Figure 18A:
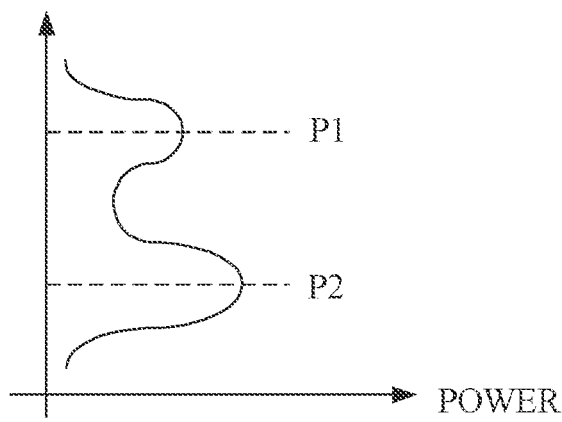
FIG. 18A and FIG. 18B are exemplary diagrams of recorded power peaks in accordance with various embodiments of the present disclosure.
Figure 18B:
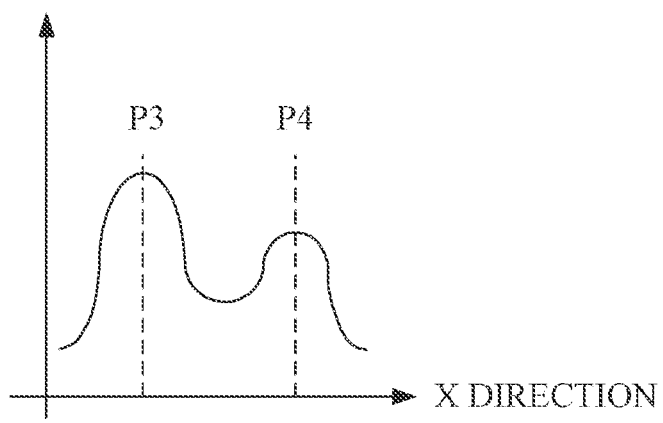

FIG. 18A and FIG. 18B are exemplary diagrams of recorded power peaks P1, P2, P3 and P4 in accordance with various embodiments of the present disclosure.

For illustration in FIG. 18A, when the test fixture 100 is moved along the Y direction, two power peaks P1 and P2 that correspond to the antennas 220 are found. In some embodiments, the power peaks P1 and P2 correspond to the antennas 220 having the coordinates (X1, Y1) and (X2, Y2) respectively.

For illustration in FIG. 18B, when the test fixture 100 is moved along the X direction, two power peaks P3 and P4 that correspond to the antennas 220 are found. In some embodiments, the power peaks P3 and P4 correspond to the antennas 220 having the coordinates (X2, Y2) and (X3, Y3) respectively.

As a result, when the power peak P1, P2, P3 or P4 is found, the power peak and a corresponding position are recorded in operation 1715. Since the test fixture 100 moves relative to the origin (0,0), the corresponding positions of the power peaks are recorded by using a coordinate system. In some embodiments, the coordinate system is defined by the origin, the X direction and the Y direction, in which the X direction is a first axis and the Y direction is a second axis.

On the other hand, when the power peak P1, P2, P3 or P4 is not found yet, the flow goes back to operation 1705 to continuously move the test fixture 100.

In operation 1720, whether the power peaks P1-P4 correspond to all the antennas 220 are recorded is determined.

When the power peaks P1-P4 are not completely recorded, the flow goes back to operation 1705 to continuously move the test fixture 100.

When all the power peaks P1-P4 are recorded, the coordinates (X1, Y1), (X2, Y2) and (X3, Y3) of the antennas 220 are obtained.

The position of the antenna 120 is calibrated to aim one of the antennas 220 according to the peak power positions in operation 1725. For example, the antenna 120 is calibrated to aim the antenna 220 corresponding to the coordinate (X2, Y2).

Based on the operations in FIG. 17, the power peaks of the signal transmissions between the antenna 120 and the antennas 220 are determined. The position of the antenna 120 is calibrated according to the power peaks to aim one of the antennas 220. The distance between the antenna 120 and the aimed antenna 220 is minimized such that the power of the signals transmissions performed therebetween is maximized. The efficiency of the test process performed by the signal transmissions between the antenna 120 and the aimed antenna 220 is increased.

In some embodiments, a method is disclosed that includes the operations outlined below. For a plurality of dies on a test fixture, wherein each of the dies includes a plurality of first antennas, an antenna distance between each of the first antennas in one of the dies and every one of the first antennas of the other dies is determined, wherein the dies are arranged in an array and positionally correspond to a plurality of under-test dies of an under-test device. The dies are categorized into a plurality of die groups, wherein the antenna distance between each of the first antennas in one of the dies in one of the die groups and every one of the first antennas of the other dies in the same one of the die groups is larger than an interference threshold. A plurality of test processes are sequentially performed on the under-test device by the first antennas of the dies in the die groups, and each of the test processes is performed according to signal transmissions between the first antennas and a plurality of second antennas of the under-test device, wherein each of the second antennas positionally corresponds to one of the first antennas.

Also disclosed is a method that is disclosed that includes the operations outlined below. Dies are arranged on a test fixture, and each of the dies includes first antennas and at least one via array, wherein the at least one via array is formed between at least two of the first antennas to separate the first antennas. By the first antennas of the dies, test processes are sequentially performed on an under-test device including second antennas that positionally correspond to the first antennas, according to signal transmissions between the first antennas and the second antennas.

Also disclosed is a method that is disclosed that includes the operations outlined below. By first antennas of dies on a test fixture, test processes are sequentially performed on an under-test device including second antennas that positionally correspond to the first antennas, according to signal transmissions between the first antennas and the second antennas. An antenna distance between each of the first antennas of one of the dies in one of die groups and every one of the first antennas of the other dies in the same one of the die groups is larger than an interference threshold.

In this document, the term "connected" may be termed as "electrically connected", and the term "coupled" may be termed as "electrically coupled". "Connected" and "coupled" may also be used to indicate that two or more elements cooperate or interact with each other.

The number and configuration of the dies, the under-test dies, the die groups and the antennas therein in this document are for illustrative purposes. Various numbers and configurations of the dies, the under-test dies, the die groups and the antennas therein are within the contemplated scope of the present disclosure.

The number and configuration of the via arrays, the vias and the shielding planes therein in this document is for illustrative purposes. Various numbers and configurations of the via arrays, the vias and the shielding planes therein are within the contemplated scope of the present disclosure.

The number and configuration of the wafer layers in the under-test device therein in this document are for illustrative purposes. Various numbers and configurations of wafer layers therein are within the contemplated scope of the present disclosure.

The number and configuration of the signal-forcing probe, the signal-forcing path, the signal-sensing path and the signal-receiving pad therein in this document are for illustrative purposes. Various numbers and configurations of the contact probes and the monitoring probes therein are within the contemplated scope of the present disclosure.

The above illustrations include exemplary operations, but the operations are not necessarily performed in the order shown. Operations may be added, replaced, changed order, and/or eliminated as appropriate, in accordance with the spirit and scope of various embodiments of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
 a plurality of dies each comprising:
  a plurality of antennas; and
  at least one via array disposed between at least two antennas of the plurality of antennas to separate the at least two antennas, wherein:
   the at least one via array comprises:
    a plurality of vias;

a first shielding plane connected to a first set of vias of the plurality of vias;

a second shielding plane connected to the first set of vias; and a third shielding plane connected to a second set of vias of the plurality of vias, the first set of vias are disposed between the first shielding plane and the second shielding plane, the second set of vias are disposed between the second shielding plane and the third shielding plane, a first surface of the at least one via array faces a first antenna of the at least two antennas, a second surface of the at least one via array faces away from the first antenna of the at least two antennas, and in a first direction extending from the first surface toward the second surface, the at least one via array comprises a plurality of quadrilateral elements.

2. The circuit of claim 1, wherein the at least one via array comprises an electric-shielding material.

3. The circuit of claim 2, wherein the electric-shielding material is metal.

4. The circuit of claim 1, wherein a middle of each quadrilateral element of the plurality of quadrilateral elements comprises a different material than a material of the at least one via array.

5. The circuit of claim 1, wherein the second shielding plane is connected to the second set of vias.

6. The circuit of claim 1, wherein:
the at least two antennas comprises a second antenna, a third antenna, and a fourth antenna,
the second surface of the at least one via array faces the second antenna and the third antenna, and
the first surface of the at least one via array faces the fourth antenna.

7. The circuit of claim 6, wherein the at least one via array extends from a location between the first antenna and the third antenna to a location between the second antenna and the fourth antenna.

8. The circuit of claim 1, wherein a longest dimension of the at least one via array extends in a second direction perpendicular to the first direction.

9. A circuit, comprising:
a plurality of dies each comprising:
a plurality of antennas; and
at least one via array comprising a plurality of vias, wherein:
the at least one via array is disposed between a first antenna of the plurality of antennas and a second antenna of the plurality of antennas in a first direction, and
the plurality of vias are arranged into at least a first row of vias and a second row of vias extending in a second direction perpendicular to the first direction,
the second row of vias is offset in the second direction from the first row of vias,
in the first direction, at least two vias of the second row of vias are arranged between a first via of the first row of vias and a second via of the first row of vias, and
in the first direction, at least two vias of the first row of vias are arranged between a first via of the second row of vias and a second via of the second row of vias.

10. The circuit of claim 9, wherein the plurality of vias are arranged into at least a first column of vias and a second column of vias extending in the first direction.

11. The circuit of claim 9, wherein the at least one via array comprises an electric-shielding material.

12. The circuit of claim 11, wherein the electric-shielding material is metal.

13. The circuit of claim 1, wherein the plurality of quadrilateral elements have a quadrilateral shape in a cross-section perpendicular to the first direction.

14. A circuit, comprising:
a plurality of dies each comprising:
a first antenna;
a second antenna;
a third antenna;
a fourth antenna; and
at least one via array, wherein:
a first surface of the at least one via array faces the first antenna and the fourth antenna,
a second surface of the at least one via array faces the second antenna and the third antenna,
the at least one via array extends from a location between the first antenna and the third antenna to a location between the second antenna and the fourth antenna, and
in a first direction extending from the first surface toward the second surface, the at least one via array comprises a plurality of quadrilateral elements.

15. The circuit of claim 14, wherein the at least one via array comprises an electric-shielding material.

16. The circuit of claim 15, wherein the electric-shielding material is metal.

17. The circuit of claim 14, wherein a middle of each quadrilateral element of the plurality of quadrilateral elements comprises a different material than a material of the at least one via array.

18. The circuit of claim 14, wherein the at least one via array comprises
a plurality of vias; and
a first shielding plane connected to a first set of vias of the plurality of vias.

19. The circuit of claim 18, wherein the at least one via array comprises:
a second shielding plane connected to the first set of vias, wherein the first set of vias are between the first shielding plane and the second shielding plane.

20. The circuit of claim 14, wherein a longest dimension of the at least one via array extends in a second direction perpendicular to the first direction.

* * * * *